US011605687B2

(12) United States Patent
Han et al.

(10) Patent No.: US 11,605,687 B2
(45) Date of Patent: Mar. 14, 2023

(54) PIXEL AND DISPLAY APPARATUS INCLUDING THE SAME

(71) Applicant: Samsung Display Co., Ltd., Yongin-si (KR)

(72) Inventors: Seokkyu Han, Yongin-si (KR); Younggil Park, Yongin-si (KR); Jeonghun Kwak, Yongin-si (KR); Kihyun Kim, Yongin-si (KR); Sungwook Woo, Yongin-si (KR); Sunwoo Lee, Yongin-si (KR); Huiyeon Choe, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/319,580

(22) Filed: May 13, 2021

(65) Prior Publication Data
US 2022/0005902 A1   Jan. 6, 2022

(30) Foreign Application Priority Data

Jul. 2, 2020 (KR) .......................... 10-2020-0081672

(51) Int. Cl.
*H01L 27/14* (2006.01)
*H01L 27/32* (2006.01)
(Continued)

(52) U.S. Cl.
CPC ...... *H01L 27/3262* (2013.01); *H01L 27/3276* (2013.01); *H01L 27/124* (2013.01);
(Continued)

(58) Field of Classification Search
CPC ............. H01L 27/3262; H01L 27/3276; H01L 27/1225; H01L 27/124; H01L 27/1251;
(Continued)

(56) References Cited

U.S. PATENT DOCUMENTS 9,703,160 B2   7/2017  Yi
11,189,732 B2 *  11/2021  Yuan .................. H01L 29/78618
(Continued)

FOREIGN PATENT DOCUMENTS

KR   10-0611152   8/2006
KR   10-0719696   5/2007
(Continued)

*Primary Examiner* — Tan N Tran
(74) *Attorney, Agent, or Firm* — Kile Park Reed & Houtteman PLLC

(57) ABSTRACT

The display apparatus includes a substrate, a first active layer disposed on the substrate, a first gate layer disposed on a layer covering the first active layer, the first gate layer including a first gate electrode, a second gate layer disposed on a layer covering the first gate layer, the second gate layer including an initialization line including a first part of a second electrode; a second active layer disposed on a layer covering the second gate layer, the second active layer including a second active region overlapping the first part of the second electrode; a third gate layer disposed on a layer covering the second active layer, the third gate layer including a second part of the second electrode overlapping the second active region; and a first source/drain layer disposed on a layer covering the third gate layer, the first source/drain layer including a first connection line.

20 Claims, 13 Drawing Sheets

(51) Int. Cl.
 *H01L 27/12* (2006.01)
 *H01L 29/786* (2006.01)
(52) U.S. Cl.
 CPC ...... *H01L 27/1225* (2013.01); *H01L 27/1251* (2013.01); *H01L 29/7869* (2013.01); *H01L 29/78648* (2013.01); *H01L 29/78675* (2013.01)
(58) Field of Classification Search
 CPC ......... H01L 29/78648; H01L 29/78675; H01L 29/7869; H01L 27/3246; H01L 51/5262; H01L 51/5281; H01L 27/1248
 USPC ............................................. 257/40, 59, 72
 See application file for complete search history.

(56) References Cited

U.S. PATENT DOCUMENTS

| | | |
|---|---|---|
| 2005/0116630 A1 | 6/2005 | Kim et al. |
| 2009/0305468 A1 | 12/2009 | Jung et al. |
| 2019/0088794 A1 | 3/2019 | Jeong et al. |

FOREIGN PATENT DOCUMENTS

| | | |
|---|---|---|
| KR | 10-1510212 | 4/2015 |
| KR | 10-1687468 | 12/2016 |
| KR | 10-1922915 | 11/2018 |
| KR | 10-1937418 | 1/2019 |
| KR | 10-2019-0032681 | 3/2019 |

\* cited by examiner

PIXEL AND DISPLAY APPARATUS INCLUDING THE SAME

CROSS-REFERENCE TO RELATED APPLICATION(S)

This application claims priority to and benefits of Korean Patent Application No. 10-2020-0081672 under 35 U.S.C. § 119, filed in the Korean Intellectual Property Office on Jul. 2, 2020, the entire contents of which are incorporated herein by reference.

BACKGROUND

1. Technical Field

One or more embodiments relate to a pixel with improved characteristics and reduced defects, and a display apparatus including the same.

2. Description of the Related Art

Among display apparatuses, an organic light-emitting display apparatus has a wide viewing angle, a high contrast, and a fast response time. Thus, the organic light-emitting display apparatus has attracted attention as a next-generation display apparatus.

An organic light-emitting display apparatus may include thin-film transistors (TFTs) and organic light-emitting devices above a substrate, and the organic light-emitting devices may emit light by themselves. Organic light-emitting display apparatuses may be used as displays for small products such as mobile phones or large products such as televisions.

Such display apparatuses may include driving TFTs, capacitors, and the like. A TFT may include a semiconductor layer including an active region, a source region, and a drain region, and a gate electrode electrically insulated from the semiconductor layer by a gate insulating layer.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In a conventional display apparatus, defects due to a change in device characteristics may be caused by a structural problem of a pixel circuit.

One or more embodiments may include a pixel having improved characteristics and reduced defects through an improved structure of a pixel circuit, and a display apparatus including the pixel. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus may include a substrate including a display area in which pixel circuits may be disposed, a first active layer disposed on the substrate, the first active layer including a first source region, a first active region adjacent to the first source region, and a first drain region adjacent to the first active region. The display apparatus may include a first gate layer disposed on a layer covering the first active layer, the first gate layer including a first gate electrode overlapping the first active region, a second gate layer disposed on a layer covering the first gate layer, the second gate layer including an initialization line extending in a first direction and including a first part of a second gate electrode, a second active layer disposed on a layer covering the second gate layer, the second active layer including a second active region overlapping the first part of the second gate electrode, a third gate layer disposed on a layer covering the second active layer, the third gate layer including a second part of the second gate electrode overlapping the second active region, the second part of the second gate electrode having an isolated shape, and a first source or drain layer disposed on a layer covering the third gate layer, the first source or drain layer including a first connection line extending in the first direction.

According to an embodiment, the first connection line may not overlap the first part of the second gate electrode and the second part of the second gate electrode.

According to an embodiment, the first part of the second gate electrode and the second part of the second gate electrode may be electrically connected to each other through a first gate contact hole formed in a layer between the second gate layer and the third gate layer.

According to an embodiment, the first gate contact hole may expose an upper surface of the first part of the second gate electrode and may include an inner surface inclined with respect to the upper surface of the first part of the second gate electrode, and the second part of the second gate electrode may cover the upper surface of the first part of the second gate electrode exposed through the first gate contact hole and the inner surface of the first gate contact hole.

According to an embodiment, a diameter of the upper surface of the first part of the second gate electrode exposed through the first gate contact hole may be less than a distance between an end of the first gate contact hole in a direction of the second active region and an end of the second active region in a direction of the first gate contact hole.

According to an embodiment, a cross-sectional area of the first gate contact hole parallel to the upper surface of the first part of the second gate electrode may increase in a direction away from the first part of the second gate electrode.

According to an embodiment, the second part of the second gate electrode may have a portion extending from a portion within the first gate contact hole and disposed on the layer covering the second active layer.

According to an embodiment, the pixel circuits may include a first pixel circuit and a second pixel circuit, and the first pixel circuit and the second pixel circuit may be symmetric with respect to a virtual axis between the first pixel circuit and the second pixel circuit.

According to an embodiment, the first part of a second gate electrode corresponding to the first pixel circuit and the first part of the second gate electrode corresponding to the second pixel circuit may be integral with each other, the second part of the second gate electrode corresponding to the first pixel circuit and the second part of the second gate electrode corresponding to the second pixel circuit may be integral with each other, and the first gate contact hole may be disposed on the virtual axis.

According to an embodiment, the third gate layer may include a gate initialization voltage line extending in the first direction, and the first connection line may overlap the gate initialization voltage line.

According to an embodiment, the gate initialization voltage line may be electrically connected to the second active layer through a second gate contact hole formed in the layer covering the second active layer.

According to an embodiment, the display apparatus may further include a second source or drain layer disposed on a layer covering the first source drain layer, wherein the second source or drain layer includes a second connection line extending in a second direction intersecting with the first direction and electrically connected to the first connection line.

According to an embodiment, the first active layer may include a silicon semiconductor, and the second active layer may include an oxide semiconductor.

According to one or more embodiments, a pixel may include an organic light-emitting diode, a first transistor including a first semiconductor layer including a silicon semiconductor and a first gate electrode, wherein the first transistor controls a current flowing to the organic light-emitting diode according to a voltage applied to the first gate electrode, a second transistor electrically connected to the first transistor, the second transistor including a second semiconductor layer including an oxide semiconductor, a first part of the second gate electrode disposed below the second semiconductor layer, and a second part of the second gate electrode disposed above the second semiconductor layer and having an isolated shape, an initialization line extending in a first direction, the initialization line including the second part of the second gate electrode, and a first connection line extending in the first direction.

According to an embodiment, the first connection line may not overlap the first part of the second gate electrode and the second part of the second gate electrode.

According to an embodiment, the first part of the second gate electrode and the second part of the second gate electrode may be electrically connected to each other through a first gate contact hole, the first gate contact hole may expose an upper surface of the first part of the second gate electrode and may include an inner surface inclined with respect to the upper surface of the first part of the second gate electrode, and the second part of the second gate electrode may cover the upper surface of the first part of the second gate electrode exposed through the first gate contact hole and the inner surface of the first gate contact hole.

According to an embodiment, a diameter of the upper surface of the first part of the second gate electrode exposed through the first gate contact hole may be less than a distance between an end of the first gate contact hole in a direction of the an active region of the second semiconductor layer and an end of the active region in a direction of the first gate contact hole.

According to an embodiment, a cross-sectional area of the first gate contact hole parallel to the upper surface of the first part of the second gate electrode may increase in a direction away from the upper surface of the first part of the second gate electrode.

According to an embodiment, the second part of the second gate electrode may have a portion extending from a portion within the first gate contact hole and disposed on a layer covering the second semiconductor layer.

According to an embodiment, the pixel may further include a second connection line extending in a second direction intersecting with the first direction and electrically connected to the first connection line.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
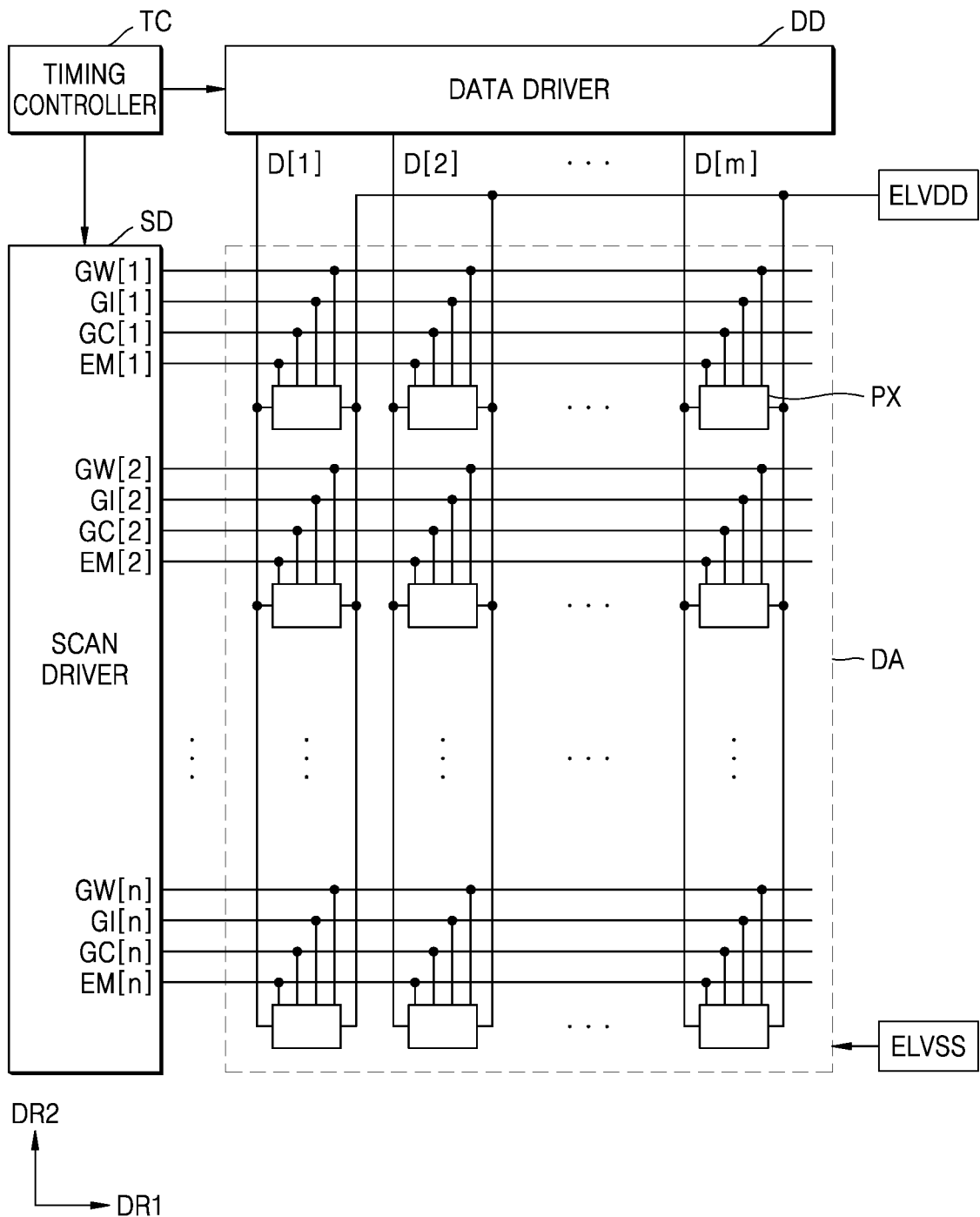
FIG. 1 is a schematic diagram of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

Because the disclosure may have diverse modified embodiments, a limited number of embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

An expression used in the singular encompasses the expression of the plural, unless it has a clearly different meaning in the context.

It will be further understood that terms such as "comprises", "has", and "includes", used herein specify the presence of stated features or elements, but do not preclude the presence or addition of one or more other features or elements.

It will be understood that when a layer, region, or element is referred to as being "formed on" another layer, area, or element, it may be directly or indirectly formed on another layer, region, or element. For example, intervening layers, regions, or elements may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

The term "dead space" may be understood as a space which is devoted to accommodating one or more components that, either singularly or plurally, perform an intended function.

In this specification, the expression "A and/or B" indicates only A, only B, or both A and B. The expression "at least one of A and B" indicates only A, only B, or both A and B.

In the following embodiments, it will be understood that when a layer, region, or element is referred to as being "connected to" or "coupled to" another layer, region, or element, it may be directly or indirectly connected or coupled to another layer, region, or element. For example, intervening layers, regions, or elements may be present. In the following embodiments, it will be understood that when a layer, region, or element is referred to as being "electrically connected to" or "electrically coupled to" another layer, region, or element, it may be directly or indirectly electrically connected or coupled to another layer, region, or element. For example, intervening layers, regions, or elements may be present.

In the following embodiments, the expression "(an element) extends in a first direction or a second direction" may include a case in which "(an element) extends in a linear shape" and a case in which "(an element) extends in a zigzag or curved shape in a first direction or a second direction."

In the following embodiments, it will be understood that when a first element "overlaps" a second element, the first element may be disposed (e.g., located) above or below the second element. The expression "not overlap" may include "apart from" or "set aside from" or "offset from" and any other suitable equivalents as would be appreciated and understood by those of ordinary skill in the art.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic diagram of a display apparatus according to an embodiment.

The display apparatus according to an embodiment may be implemented as an electronic apparatus, such as a smartphone, a mobile phone, a navigation device, a game console, a television (TV), a vehicle head unit, a notebook computer, a laptop computer, a tablet computer, a personal media player (PMP), or a personal digital assistant (PDA). Also, the electronic apparatus may be flexible.

Although an organic light-emitting display apparatus including an organic light-emitting diode is described as an example of the display apparatus according to an embodiment, the disclosure is not limited thereto. A light-emitting diode of the display apparatus may include an inorganic light-emitting diode including an inorganic material. The inorganic light-emitting diode may include a PN junction diode including inorganic semiconductor-based materials. In case that a voltage is applied to the PN junction diode in a forward direction, holes and electrons may be injected and recombined to generate energy. The PN junction diode may convert the generated energy into light energy to emit light of a certain color. The inorganic light-emitting diode may have a width of several micrometers to several hundred micrometers. In some embodiments, the inorganic light-emitting diode may be referred to as a micro LED.

As illustrated in FIG. 1, the display apparatus according to an embodiment may include a display area DA including pixels PX, a scan driver SD, a data driver DD, and a timing controller TC that may control the scan driver SD, and the data driver DD.

The scan driver SD may supply scan signals GW[1] to GW[n], initialization signals GI[1] to GI[n], compensation control signals GC[1] to GC[n], and emission control signals EM[1] to EM[n] to scan lines extending in a first direction DR1 under the control of the timing controller TC. For example, the scan driver SD may sequentially supply the scan signals GW[1] to GW[n], the initialization signals GI[1] to GI[n], the compensation control signals GC[1] to GC[n], and the emission control signals EM[1] to EM[n] to scan lines, initialization lines, compensation control lines, and emission control lines, respectively.

The data driver DD may supply data signals D[1] to D[m] to data lines extending in a second direction DR2 under the control of the timing controller TC. The data driver DD may supply the data signals D[1] to D[m] so as to be synchronized with the scan signals GW[1] to GW[n]. Accordingly, the data signals D[1] to D[m] may be supplied to the pixels PX selected by the scan signals GW[1] to GW[n].

The timing controller TC may control the scan driver SD and the data driver DD in response to synchronization signals supplied from the outside.

A power supply voltage ELVDD and an electrode voltage ELVSS may be supplied to the pixels PX in the display area DA. The pixels PX, which may receive the power supply voltage ELVDD and the electrode voltage ELVSS, may control an amount of current flowing from a driving voltage line through an organic light-emitting diode to an electrode power line in response to the data signals D[1] to D[m], and may generate light with luminance corresponding to the data signals D[1] to D[m]. The power supply voltage ELVDD may be applied to the driving voltage line, and the electrode voltage ELVSS may be applied to the electrode power line.

Although FIG. 1 illustrates that the pixels PX in the display area DA may be sequentially disposed (e.g., arranged) in the first direction DR1 and the second direction DR2, the disclosure is not limited thereto. For example, the pixels PX may be arranged in various forms, for example, a stripe arrangement, a PENTILE arrangement, a mosaic arrangement, and the like. Although FIG. 1 illustrates that the display area DA has a rectangular shape on the layout diagram, the disclosure is not limited thereto. For example, the display area DA may have a polygonal shape (e.g., a triangular shape, a pentagonal shape, a hexagonal shape, etc.), a circular shape, an elliptical shape, or an irregular shape.

Figure 2:
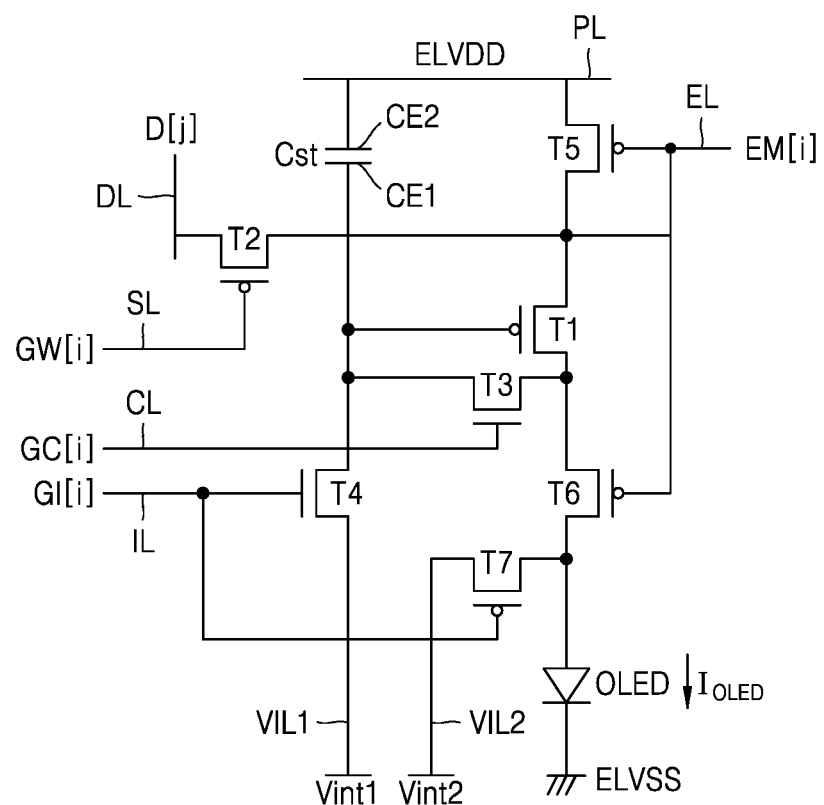
FIG. 2 is a schematic diagram of an equivalent circuit of a pixel included in the display apparatus of FIG. 1, according to an embodiment.

FIG. 2 is a schematic diagram of an equivalent circuit of a pixel PX included in the display apparatus of FIG. 1, according to an embodiment.

Referring to FIG. 2, the pixel PX may include first to seventh transistors T1 to T7, a storage capacitor Cst, an organic light-emitting diode OLED, a gate initialization voltage line VIL1, an anode initialization voltage line VIL2, a driving voltage line PL, and signal lines. The signal lines may include a data line DL, a scan line SL, an initialization line IL, a compensation control line CL, and an emission control line EL. At least one of the signal lines, the gate initialization voltage line VIL1, the anode initialization voltage line VIL2, and the driving voltage line PL may be shared by neighboring pixels.

The driving voltage line PL may transmit the power supply voltage ELVDD to the first transistor T1. The gate initialization voltage line VIL1 may transmit, to the pixel PX, a first initialization voltage Vint1 for initializing the first transistor T1. The anode initialization voltage line VIL2 may transmit, to the pixel PX, a second initialization voltage Vint2 for initializing the organic light-emitting diode OLED.

Although FIG. 2 illustrates that the third transistor T3 and the fourth transistor T4 among the first to seventh transistors T1 to T7 may be implemented as n-channel metal-oxide-semiconductor field effect transistors (MOSFETs) (NMOSs) and others thereof may be implemented as p-channel MOSFETs (PMOSs), the disclosure is not limited thereto.

The first transistor T1 may be a driving transistor. The first transistor T1 may be electrically connected to the driving voltage line PL through the fifth transistor T5 and electrically connected to the organic light-emitting diode OLED through the sixth transistor T6. The first transistor T1 may receive the data signal D[j] according to a voltage applied to a first gate electrode G1, and control an amount of driving current $I_{OLED}$ flowing from a node electrically connected to the driving voltage line PL through the organic light-emitting diode OLED to the electrode power line.

The second transistor T2 may be a switching transistor. The second transistor T2 may be electrically connected to the scan line SL and the data line DL and electrically connected to the driving voltage line PL through the fifth transistor T5. The second transistor T2 located at an $i^{th}$ row among a total of n rows may be turned on according to the scan signal GW[i] received through the scan line SL and perform a switching operation of transmitting the data signal D[j] received through the data line DL located at a $j^{th}$ column among a total of m columns to a node electrically connected to the first transistor T1. i may be a natural number from 1 to n, and j may be a natural number from 1 to m.

The third transistor T3 may be a compensation control transistor. The third transistor T3 may be electrically connected to the compensation control line CL and electrically connected to the organic light-emitting diode OLED through the sixth transistor T6. The third transistor T3 may be turned on according to the compensation control signal GC[i] received through the compensation control line CL and diode-connect the first transistor T1.

The fourth transistor T4 may be a gate initialization transistor. The fourth transistor T4 may be electrically connected to the initialization line IL and the gate initialization voltage line VIL1, may be turned on according to the initialization voltage GI(i) received through the initialization line IL, and transmit the first initialization voltage Vint1 from the gate initialization voltage line VIL1 to a gate electrode of the first transistor T1 so as to initialize a voltage of the gate electrode of the first transistor T1.

The fifth transistor T5 may be an operation control transistor, and the sixth transistor T6 may be an emission control transistor. The fifth transistor T5 and the sixth transistor T6 may be electrically connected to the emission control line EL and may be simultaneously turned on according to the emission control signal EM[i] received through the emission control line EL to form a current path such that the driving current $I_{OLED}$ flows from the driving voltage line PL toward the organic light-emitting diode OLED.

The seventh transistor T7 may be an anode initialization transistor. The seventh transistor T7 may be electrically connected to the emission control line EL and the anode initialization voltage line VIL2, may be turned on according to the emission control signal EM[n] received through the emission control line EL, and transmit the second initialization voltage Vint2 from the anode initialization voltage line VIL2 to the organic light-emitting diode OLED so as to initialize the organic light-emitting diode OLED. The seventh transistor T7 may be omitted.

The storage capacitor Cst may include a lower electrode CE1 and an upper electrode CE2. The lower electrode CE1 may be electrically connected to the first gate electrode of the first transistor T1, and the upper electrode CE2 may be electrically connected to the driving voltage line PL. The lower electrode CE1 and the first gate electrode may be integral with each other. The storage capacitor Cst may store and maintain a voltage corresponding to a difference between voltages of the driving voltage line PL and the first gate electrode of the first transistor T1, so that the voltage applied to the first gate electrode of the first transistor T1 may be maintained.

The organic light-emitting diode OLED may include a pixel electrode, an opposite electrode, and an intermediate layer arranged therebetween and including an emission layer. The electrode voltage ELVSS may be applied to the opposite electrode integrally formed in the pixels. The organic light-emitting diode OLED may receive the driving current $I_{OLED}$ from the first transistor T1 and emit light, so that the display apparatus displays an image. For reference, the opposite electrode may extend outside the display area and may be electrically connected to the electrode power line, and the electrode voltage ELVSS may be applied to the electrode power line.

Figure 3:
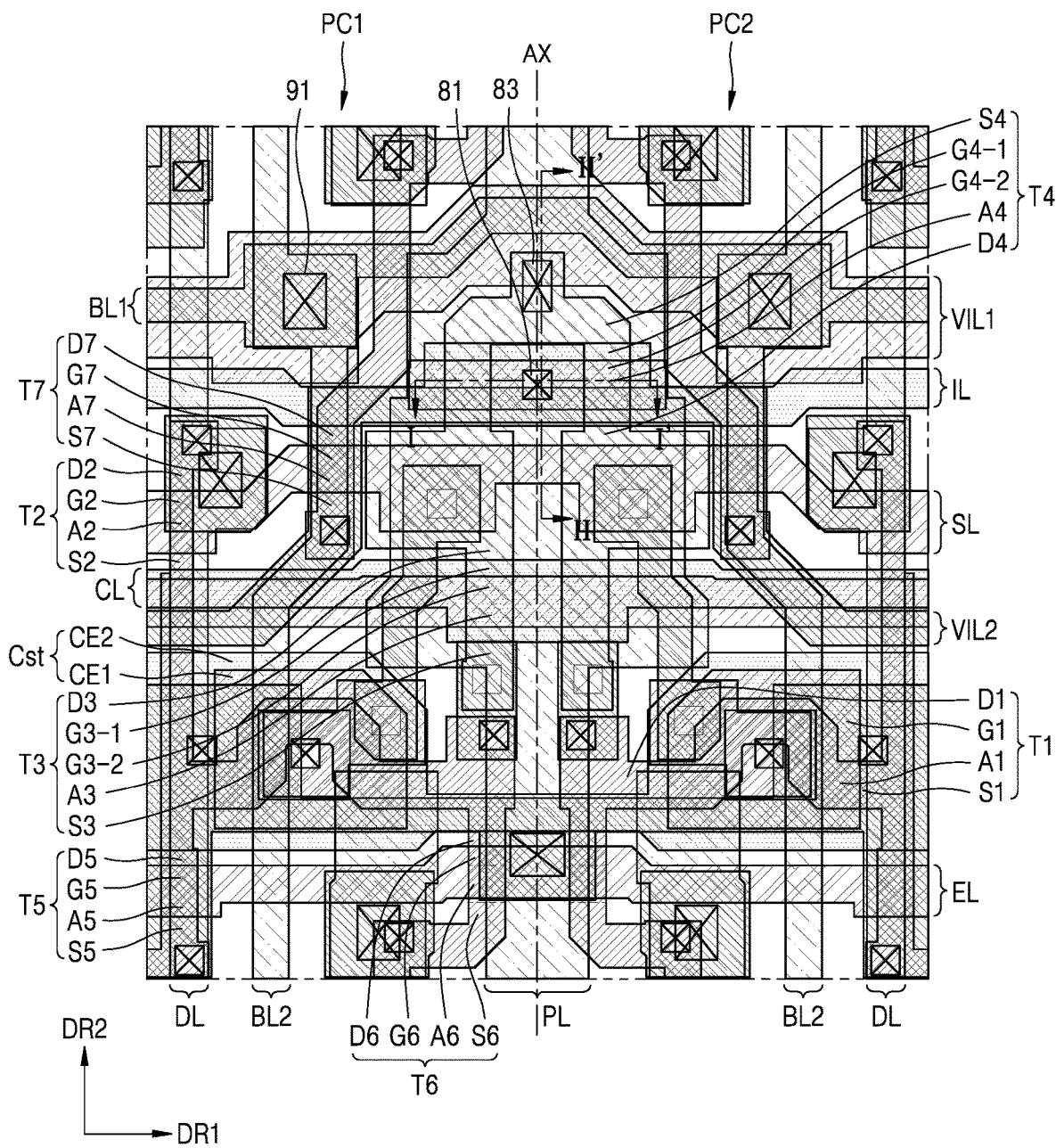
FIG. 3 is a schematic layout diagram of pixel circuits included in the display apparatus of FIG. 1, according to an embodiment.

FIG. 3 is a schematic layout diagram of pixel circuits included in the display apparatus of FIG. 1, according to an embodiment.

FIG. 3 illustrates a pair of pixel circuits of adjacent columns arranged in a same row. For reference, in FIG. 3, the illustration of organic light-emitting diodes OLED is omitted for convenience. The pixel circuits PC may be arranged to form a matrix in a direction DR1 and in a direction DR2. FIG. 3 illustrates a pair of pixel circuits PC1 and PC2 of adjacent columns arranged in a same row.

In an embodiment, as illustrated in FIG. 3, the first pixel circuit PC1 arranged on the left side and the second pixel circuit PC2 arranged on the right side may have a bilateral symmetric structure. For example, the first pixel circuit PC1 and the second pixel circuit PC2 may be symmetric with respect to a virtual axis AX passing therebetween.

Each of the first and second pixel circuits PC1 and PC2 may include the first to seventh transistors T1 to T7 and the storage capacitor Cst.

Each of the first to seventh transistors T1 to T7 may include a semiconductor layer, and a gate electrode overlapping an active region of the semiconductor layer. Also, the semiconductor layer of each of the first to seventh transistors T1 to T7 may include a source region, an active region located adjacent to the source region, and a drain region located adjacent to the active region.

In an embodiment, at least one of the first to seventh transistors T1 to T7 may include the semiconductor layer including an oxide semiconductor, and others thereof may include the semiconductor layer including a silicon semiconductor. For example, the first transistor T1 that influences (e.g., directly influences) the brightness of the display apparatus may include the semiconductor layer including polycrystalline silicon with high reliability. In this manner, a high-resolution display apparatus may be implemented.

Because the oxide semiconductor may have a high carrier mobility and a low leakage current, a voltage drop may not be great even in case that the driving time may be long. For example, in the case of a thin-film transistor including an oxide semiconductor, a color change of an image due to a voltage drop may not be great even during low frequency driving. As such, the oxide semiconductor may have a low leakage current. For example, at least one of the third transistor T3 and the fourth transistor T4, which may be electrically connected to the first gate electrode of the first transistor T1, may include the oxide semiconductor, so that the leakage current that may flow into the first gate electrode of the first transistor T1 may be prevented and the power consumption may be reduced.

As a specific example, the first transistor T1, the second transistor T2, the fifth transistor T5, the sixth transistor T6, and the seventh transistor T7 may include transistors including the silicon semiconductor. For example, the semiconductor layer of each of the first transistor T1, the second transistor T2, the fifth transistor T5, the sixth transistor T6, and the seventh transistor T7 may be included in a first active layer AL1 including a polycrystalline silicon semiconductor, may be arranged on a same layer, and may include a same material.

Also, each of the third transistor T3 and the fourth transistor T4 may include a transistor including the oxide semiconductor. The semiconductor layer of each of the third transistor T3 and the fourth transistor T4 may be included in a second active layer AL2 including an oxide semiconductor, may be arranged on a same layer, and may include a same material.

The semiconductor layers included in the first active layer AL1 and the second active layer AL2 may be connected to each other and may be bent in various shapes. For example, because a portion of the semiconductor layer may have a bent shape such as "C," "Ω,", "S," "M," or "W," a long channel length may be formed in a narrow space. In this manner, the active regions of the transistors may be formed to be long, so that the driving range of the gate voltage applied to the gate electrode may be widened. Therefore, the gradation of light emitted from the organic light-emitting diode OLED may be more precisely controlled, and display quality may be improved. In case desirable, a portion of the semiconductor layer may have a linear shape rather than a bent shape.

The first transistor T1 may include a first semiconductor layer and a first gate electrode G1. The first semiconductor layer may include a first active region A1, and a first source region S1 and a first drain region D1 on both sides of the first active region A1. The first gate electrode G1 may be formed to have an isolated shape and overlap the first active region A1 with a first gate insulating layer 103 (see FIG. 12) therebetween.

The storage capacitor Cst may overlap the first transistor T1. The storage capacitor Cst may include a lower electrode CE1 and an upper electrode CE2. The first gate electrode G1 may function as a control electrode of the first transistor T1 and also function as the lower electrode CE1 of the storage capacitor Cst. For example, the first gate electrode G1 and the lower electrode CE1 may be integral with each other. The upper electrode CE2 of the storage capacitor Cst may overlap the lower electrode CE1 with a second gate insulating layer 105 (see FIG. 12) therebetween. The second gate insulating layer may function as a dielectric layer of the storage capacitor Cst.

The second transistor T2 may include a second semiconductor layer and a second gate electrode G2. The second semiconductor layer may include a second active region A2, and a second source region S2 and a second drain region D2 on both sides of the second active region A2. The second source region S2 may be electrically connected to the data line 181, and the second drain region D2 may be electrically connected to the first source region S1. The second gate electrode G2 may overlap the second active region A2 and may be provided as a portion of the scan line SL.

The fifth transistor T5 may include a fifth semiconductor layer and a fifth gate electrode G5. The fifth semiconductor layer may include a fifth active region A5, and a fifth source region S5 and a fifth drain region D5 on both sides of the fifth active region A5. The fifth source region S5 may be electrically connected to the driving voltage line PL, and the fifth drain region D5 may be electrically connected to the first source region S1. The fifth gate electrode G5 may overlap the fifth active region A5 and may be provided as a portion of the emission control line EL.

The sixth transistor T6 may include a sixth semiconductor layer and a sixth gate electrode G6. The sixth semiconductor layer may include a sixth active region A6, and a sixth source region S6 and a sixth drain region D6 on both sides of the sixth active region A6. The sixth source region S6 may be electrically connected to the first drain region D1, and the sixth drain region D6 may be electrically connected to a pixel electrode of the organic light-emitting diode OLED. The sixth gate electrode G6 may overlap the sixth active region A6 and may be provided as a portion of the emission control line EL.

The seventh transistor T7 may include a seventh semiconductor layer and a seventh gate electrode G7. The seventh semiconductor layer may include a seventh active region A7, and a seventh source region S7 and a seventh drain region D7 on both sides of the seventh active region A7. The seventh source region S7 may be electrically connected to the anode initialization voltage line VIL2, and the seventh drain region D7 may be electrically connected to the sixth drain region D6. The seventh gate electrode G7 may overlap the seventh active region A7 and may be provided as a portion of the initialization line IL.

The second gate insulating layer 105 (see FIG. 12) may be located on the first, second, and fifth to seventh transistors T1, T2, T5, T6, and T7 each including the silicon semiconductor, and the third and fourth transistors T3 and T4 may be arranged on the second gate insulating layer.

The semiconductor layers of the third and fourth transistors T3 and T4 may be arranged on a same layer and may include a same material. For example, the semiconductor layers of the third and fourth transistors T3 and T4 may be included in the second active layer AL2 including the oxide semiconductor.

The third transistor T3 may include a third semiconductor layer including an oxide semiconductor and a third gate electrode G3. The third semiconductor layer may include a third active region A3, and a third source region S3 and a third drain region D3 on both sides of the third active region A3. The third source region S3 may be bridged to the first gate electrode G1 through a bridge electrode. Also, the third source region S3 may be electrically connected to the fourth drain region D4 arranged on a same layer. The third drain region D3 may be electrically connected to the first semiconductor layer of the first transistor T1 and the sixth semiconductor layer of the sixth transistor T6. The third transistor T3 may have a double gate structure in which control electrodes may be provided above and below the third semiconductor layer. Specifically, the third gate electrode G3 may include a $(3-1)^{th}$ gate electrode G3-1 located on a layer covering the first gate layer GL1 and provided as a portion of the compensation control line CL, and a $(3-2)^{th}$ gate electrode G3-2 located on a layer covering the second active layer AL2.

The fourth transistor T4 may include a fourth semiconductor layer including an oxide semiconductor and a fourth gate electrode G4. The fourth semiconductor layer may include a fourth active region A4, and a fourth source region S4 and a fourth drain region D4 on both sides of the fourth active region A4. The fourth source region S4 may be electrically connected to the gate initialization voltage line VIL1, and the fourth drain region D4 may be bridged to the first gate electrode G1 through a bridge electrode. The fourth transistor T4 may include two parts, such as, e.g., a (4-1)th gate electrode and a (4-2)th gate electrode. The fourth transistor T4 may have a double gate structure in which control electrodes may be provided above and below the fourth semiconductor layer. Specifically, the fourth gate electrode G4 may include the $(4-1)^{th}$ gate electrode G4-1 located on a layer covering the first gate layer GL1 and provided as a portion of the initialization line IL, and the $(4-2)^{th}$ gate electrode G4-2 located on a layer covering the second active layer AL2 and having an isolated shape.

The $(4-1)^{th}$ gate electrode G4-1 and the $(4-2)^{th}$ gate electrode G4-2 may be electrically connected to each other through a first gate contact hole 81 formed in a layer between the second gate layer GL2 and the third gate layer GL3. The first gate contact hole 81 will be described in detail below with reference to FIGS. 11 to 13.

The scan line SL, the initialization line IL, the compensation control line CL, the emission control line EL, the gate initialization voltage line VIL1, the anode initialization voltage line VIL2, and the first connection line BL1 may extend in the first direction DR1 and may be apart from each other in each row. The data line DL, the driving voltage line PL, and the second connection line BL2 may extend in the second direction DR2 intersecting with the first direction DR1 and may be apart from each other in each column.

FIGS. 4 to 10 are schematic layout diagrams for each layer of the pixel circuits of FIG. 3.

Figure 4:
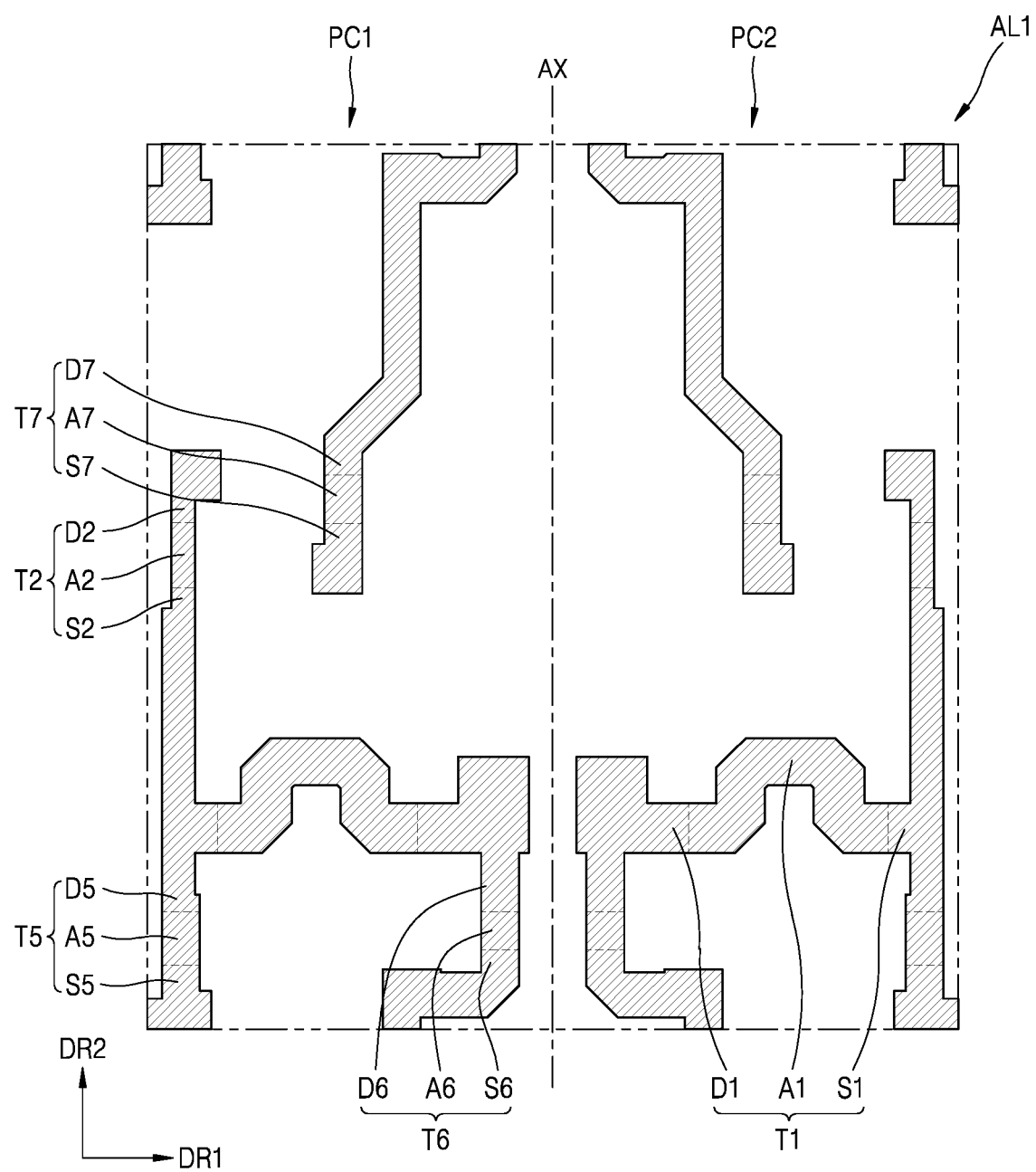
FIGS. 4 to 10 are schematic layout diagrams for each layer of the pixel circuits of FIG. 3, according to an embodiment.
Figure 5:
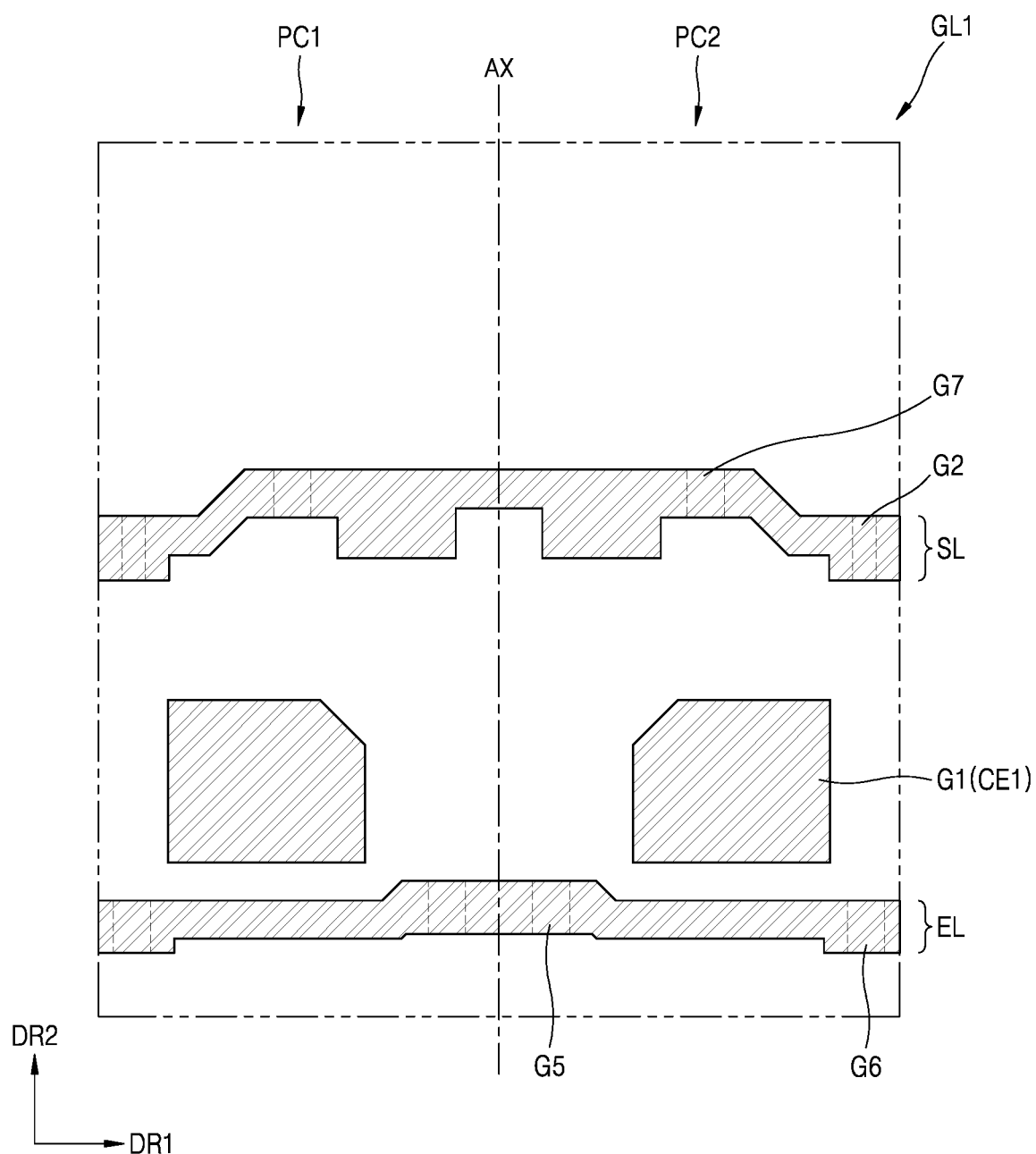
Figure 6:
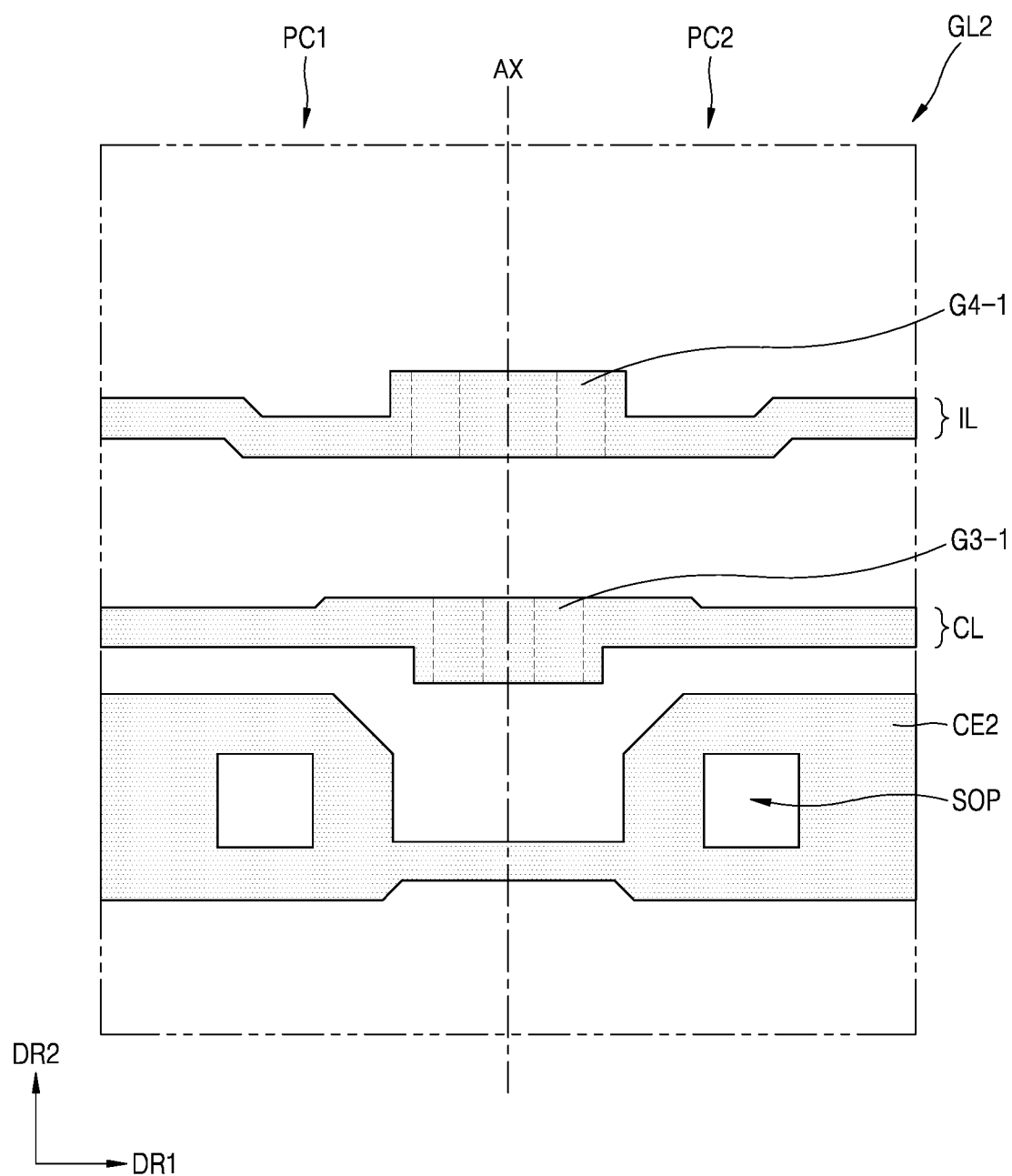
Figure 7:
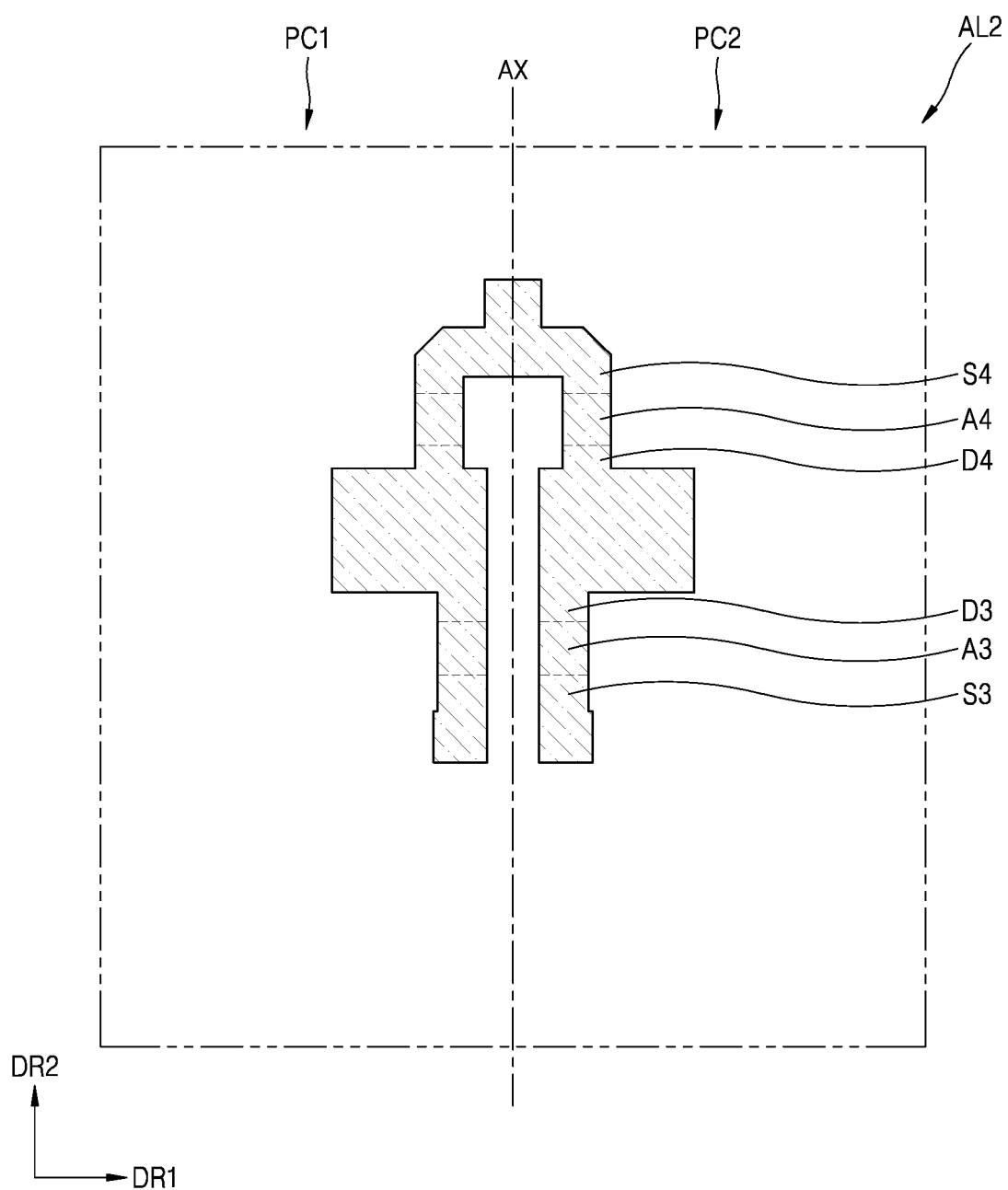
Figure 8:
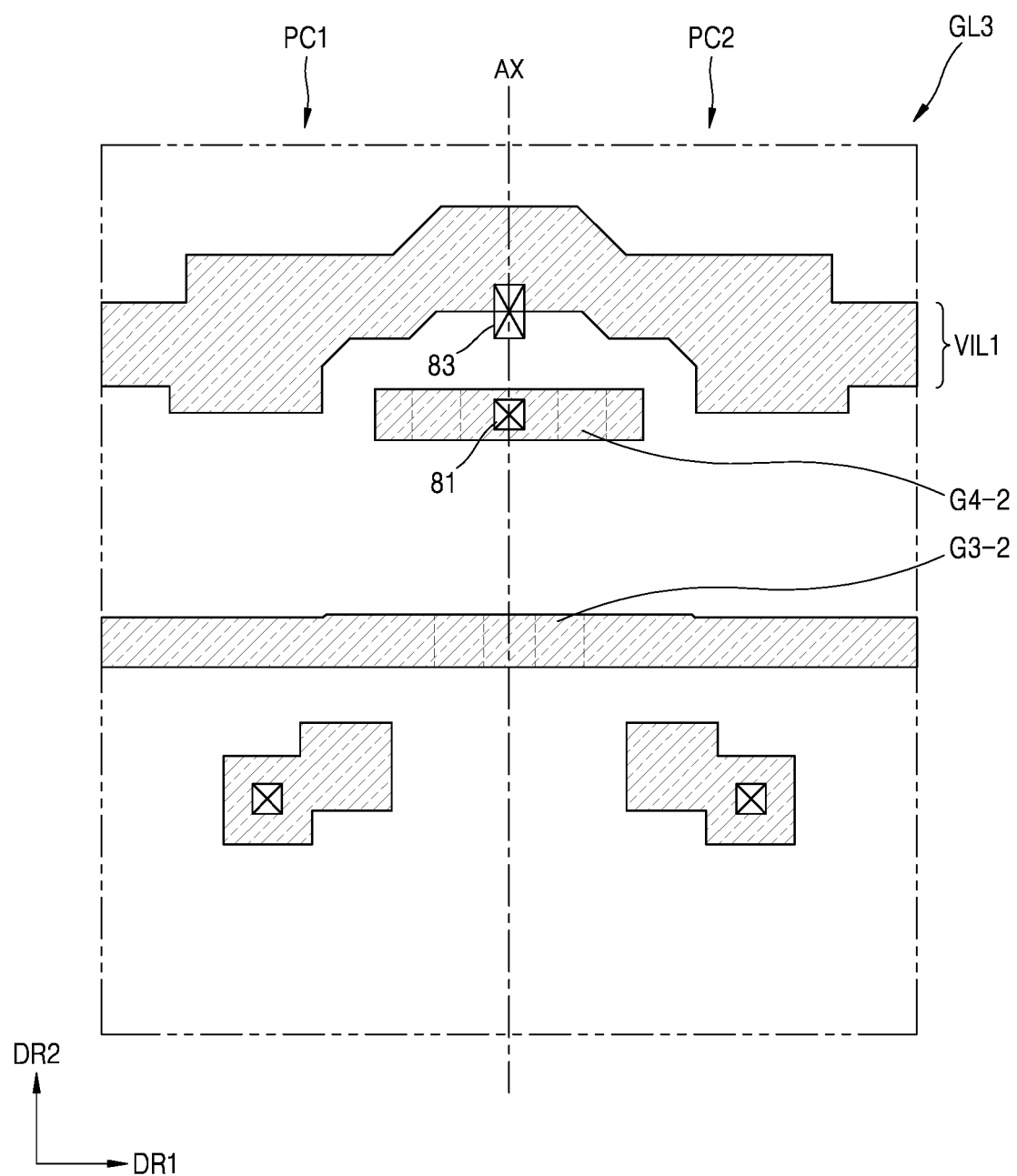
Figure 9:
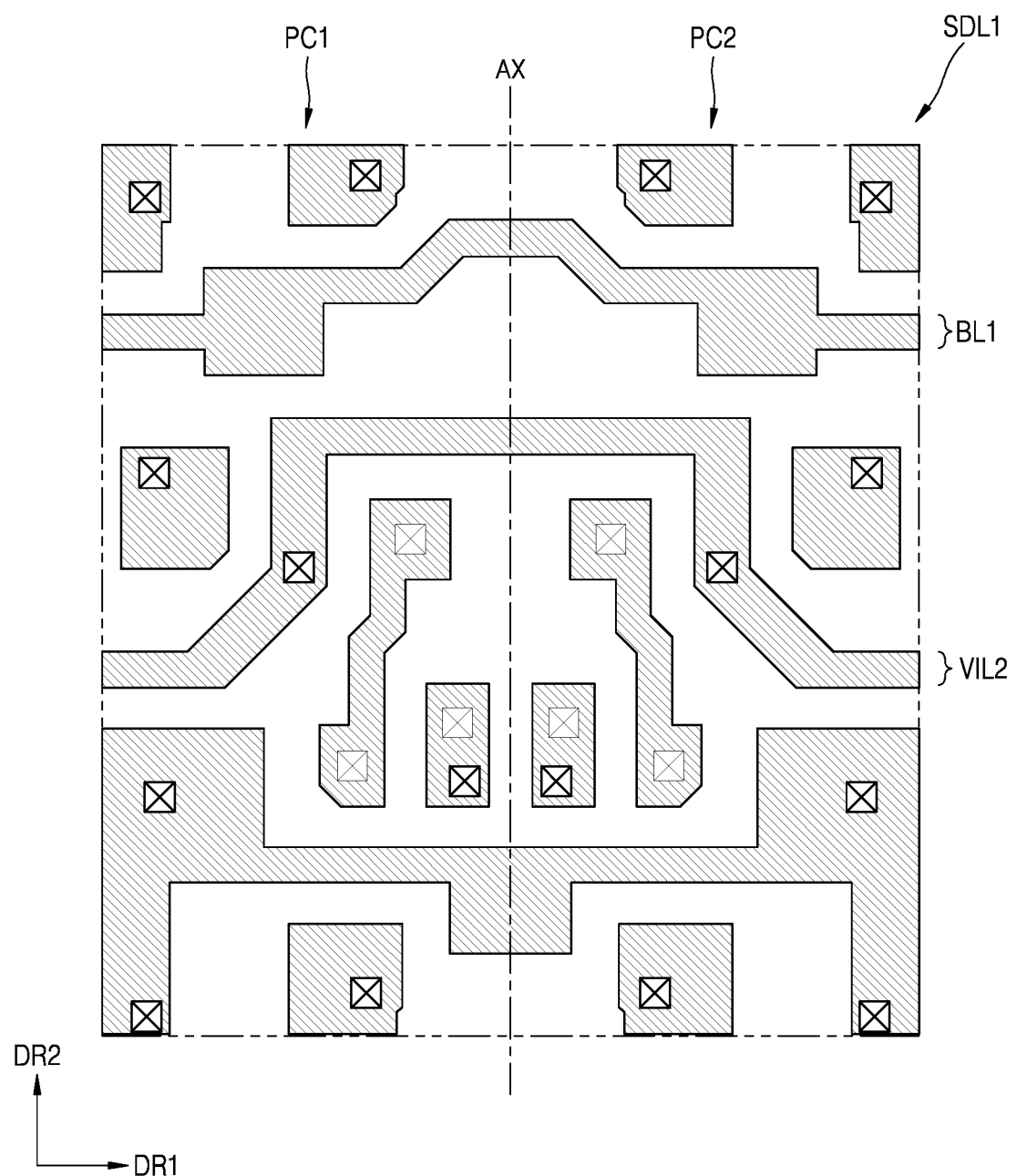
Figure 10:
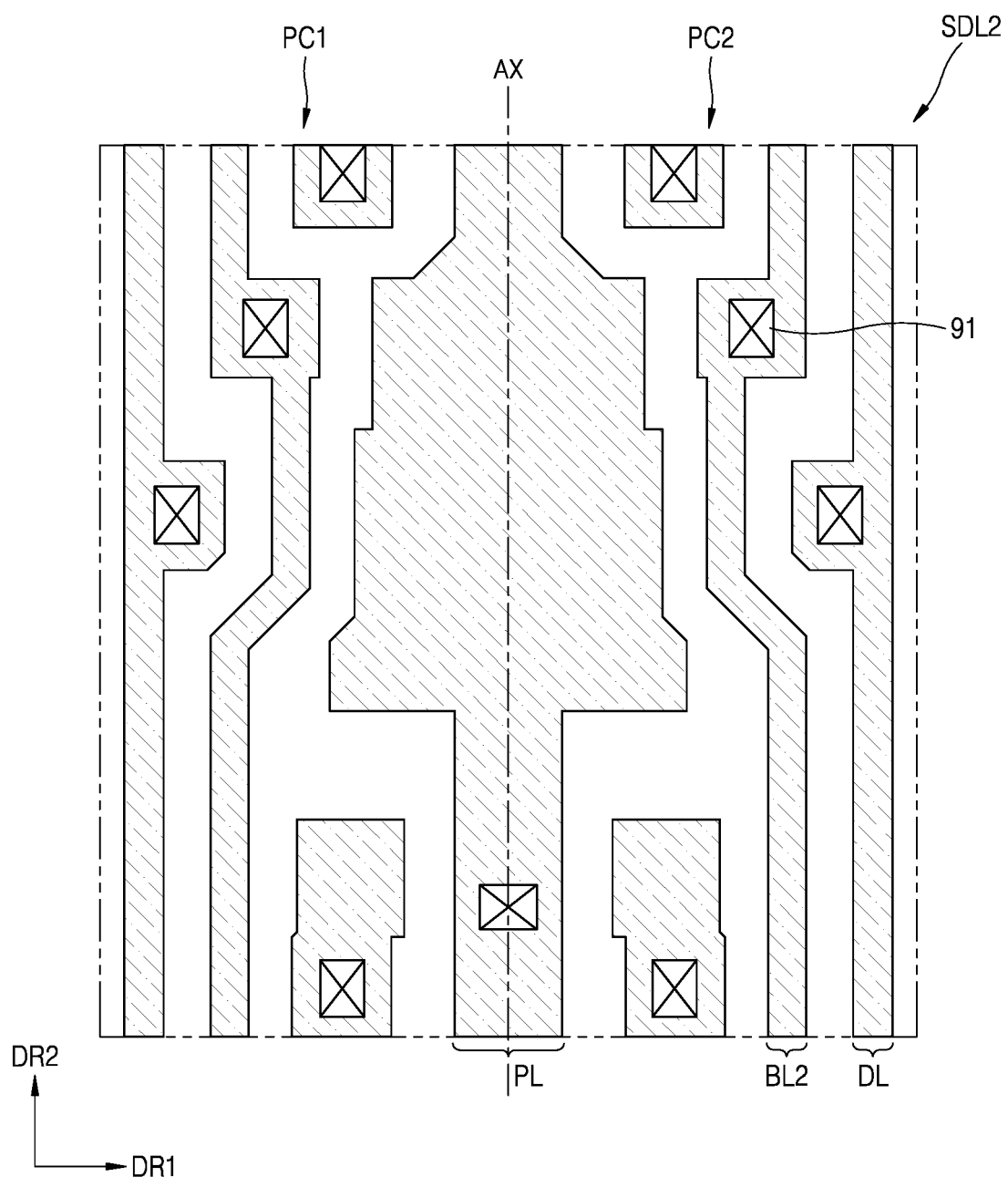
Figure 12:
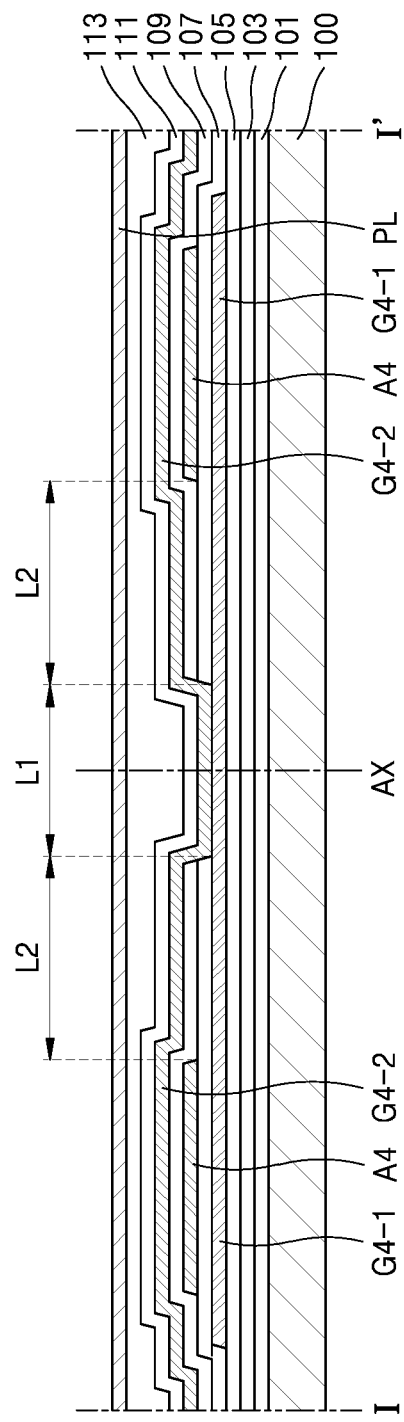
FIG. 12 is a schematic cross-sectional view of the pixel circuits taken along line I-I' of FIG. 3, according to an embodiment.

As sequentially illustrated in FIGS. 4 to 10, the first active layer AU of FIG. 4, the first gate layer GL1 of FIG. 5, the second gate layer GL2 of FIG. 6, the second active layer AL2 of FIG. 7, the third gate layer GL3 of FIG. 8, the first source/drain layer SDL1 of FIG. 9, and the second source/drain layer SDL2 of FIG. 10 may be arranged in a direction away from the substrate (see 100 of FIG. 12).

Insulating layers may be between these layers. Specifically, a first gate insulating layer 103 (see FIG. 12) may be between the first active layer AL1 of FIG. 4 and the first gate layer GL1 of FIG. 5, a second gate insulating layer 105 (see FIG. 12) may be between the first gate layer GL1 of FIG. 5 and the second gate layer GL2 of FIG. 6, a third gate insulating layer 107 (see FIG. 12) may be between the second gate layer GL2 of FIG. 6 and the second active layer AL2 of FIG. 7, a fourth gate insulating layer 109 (see FIG. 12) may be between the second active layer AL2 of FIG. 7 and the third gate layer GL3 of FIG. 8, a first interlayer insulating layer 111 (see FIG. 12) may be between the third gate layer GL3 of FIG. 8 and the first source/drain layer SDL1 of FIG. 9, and a second interlayer insulating layer 113 (see FIG. 12) may be between the first source/drain layer SDL1 of FIG. 9 and the second source/drain layer SDL2 of FIG. 10. These insulating layers may include silicon oxide, silicon nitride, silicon oxynitride, aluminum oxide, titanium oxide, tantalum oxide, hafnium oxide, and/or zinc oxide. Each of the insulating layers may have a single layer structure or a multilayer structure as desired. Elements of different layers may be electrically connected to each other through contact holes formed in these insulating layers.

The first active layer AL1 of FIG. 4 may include the semiconductor layer of each of the first transistor T1, the second transistor T2, the fifth transistor T5, the sixth transistor T6, and the seventh transistor T7.

In an embodiment, the first active layer AL1 of FIG. 4 may include a semiconductor layer including a polycrystalline silicon semiconductor. Source regions and drain regions of the first active layer AL1 may be doped with impurities, and the impurities may include N-type impurities or P-type impurities. The source region and the drain region may correspond to a source electrode and a drain electrode, respectively. The source region and the drain region may be changed to each other according to characteristics of the transistor. Hereinafter, the terms "source region" and "drain region" are used instead of the source electrode and the drain electrode. The schematic diagram of FIG. 2 illustrates that specific portions of the first active layer AL1 may be doped with P-type impurities, and the first transistor T1, the second transistor T2, and the fifth to seventh transistors T5 to T7 may be implemented as PMOSs. Other portions of the first active layer AL1 may also be doped with impurities and may serve as wirings that electrically connect the transistors and/or the capacitors to each other or serve as capacitor electrodes.

The first active layer AL1 of FIG. 4 may be located on the substrate 100. The substrate may include glass, metal, a polymer resin, or a combination thereof. In case that the substrate is flexible or bendable, the substrate may include a polymer resin, such as polyethersulphone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate may be variously modified. For example, the substrate may have a multilayer structure that includes two layers each including the above-described polymer resin, and a barrier layer between the two layers and including an inorganic material (for example, silicon oxide, silicon nitride, silicon oxynitride, or the like).

Other layers may be between the substrate and the first active layer AL1. For example, a buffer layer (see 101 of FIG. 12) including at least one of a silicon nitride layer, a silicon oxynitride layer, a silicon oxide layer, a titanium oxide layer, and an aluminum oxide layer may be between the substrate and the first active layer AL1. The buffer layer may increase flatness of the upper surface of the substrate, or may prevent or reduce the permeation of impurities from the substrate or the like to the first active layer AL1. The buffer layer may have a single layer structure or a multilayer structure as desired. In the case of the multilayer structure, some layers may be referred to as barrier layers.

The first gate layer GL1 of FIG. 5 may include the gate electrode of each of the first transistor T1, the second transistor T2, the fifth transistor T5, the sixth transistor T6, and the seventh transistor T7. Also, the first gate layer GL1 includes the scan line SL and the emission control line EL extending in the first direction DR1. The scan line SL and the emission control line EL may be integral with each other in neighboring pixels. The lower electrode CE1 of the storage capacitor Cst and the first gate electrode G1 of the first transistor T1 may be integral with each other.

Specifically, the first gate layer GL1 of FIG. 5 may include the first gate electrode G1 having an isolated shape, the second and seventh gate electrodes G2 and G7, which may be a portion of the scan line SL, and the fifth and sixth gate electrode G5 and G6, which may be a portion of the emission control line EL.

The second gate layer GL2 of FIG. 6 may include the $(3-1)^{th}$ gate electrode G3-1, which may be the lower gate electrode of the third transistor T3, the $(4-1)^{th}$ gate electrode G4-1, which may be the lower gate electrode of the fourth transistor T4, and the upper electrode CE2 of the storage capacitor Cst. Also, the second gate layer GL2 may include the initialization line IL and the compensation control line CL extending in the first direction DR1. The initialization line IL and the compensation control line CL may be integral with each other in neighboring pixels.

Specifically, the second gate layer GL2 of FIG. 6 may include the $(3-1)^{th}$ gate electrode G3-1, which may be a portion of the compensation control line CL, the $(4-1)^{th}$ gate electrode G4-1, which may be a portion of the initialization line IL, and the upper electrode CE2 having an opening SOP. The opening SOP may be defined by removing a portion of the upper electrode CE2 and may have a closed shape. A contact hole may be located in the opening SOP. The contact hole may be formed in the second to fourth gate insulating layers and the first interlayer insulating layer and electrically connect the first gate electrode G1 to the layer located thereabove. The upper electrode CE2 may be integrally formed in neighboring pixels. To this end, the upper electrode CE2 may have a bridge portion. The bridge portion refers to a portion protruding from the upper electrode CE2 in the first direction DR1.

Each of the first gate layer GL1 of FIG. 5, the second gate layer GL2 of FIG. 6, and the third gate layer GL3 of FIG. 8 to be described below may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a combination thereof. Each of these layers may have a single layer structure or a multilayer structure. In case that each of these layers has the multilayer structure, each of these layers may include various materials. For example, each of the first gate layer GL1 of FIG. 5, the second gate layer GL2 of FIG. 6, and the third gate layer GL3 of FIG. 8 may have a two-layer structure of a molybdenum layer/aluminum layer or a three-layer structure of a molybdenum layer/aluminum layer/molybdenum layer.

The second active layer AL2 of FIG. 7 may include the semiconductor layer of the third transistor T3 and the semiconductor layer of the fourth transistor T4. The semiconductor layer of the third transistor T3 and the semiconductor layer of the fourth transistor T4 may be integral with each other over neighboring pixels (for example, PC1 and PC2).

In an embodiment, the second active layer AL2 of FIG. 7 may include a semiconductor layer including an oxide. For example, the second active layer AL2 may include a Zn oxide-based material, such as Zn oxide, In—Zn oxide, Ga—In—Zn oxide, or a combination thereof. The second active layer AL2 may be variously modified. The second active layer AL2 may include an oxide semiconductor, such as In—Ga—Zn—O (IGZO), In—Sn—Zn—O (ITZO), In—Ga—Sn—Zn—O (IGTZO), or a combination thereof, in which a metal such as indium (In), gallium (Ga), or tin (Sn) may be included in ZnO.

The third gate layer GL3 of FIG. 8 may include the $(3-2)^{th}$ gate electrode G3-2, which may be the upper gate electrode of the third transistor T3, the $(4-2)^{th}$ gate electrode G4-2, which may be the upper gate electrode of the fourth transistor T4, and the gate initialization voltage line VIL1. For reference, the contact holes including the first gate contact hole 81 and the second gate contact hole 83 illustrated in FIG. 8 may be formed in at least one of the first to fourth gate insulating layers and may be connected to electrically connect the layers illustrated in FIG. 8 to the layer located therebelow.

Specifically, the third gate layer GL3 of FIG. 8 may include the $(3-2)^{th}$ gate electrode G3-2 extending in the first direction DR1, the $(4-2)^{th}$ gate electrode G4-2 having an isolated shape, and the gate initialization voltage line VIL1 extending in the first direction DR1.

In an embodiment, the $(4-1)^{th}$ gate electrode G4-1 and the $(4-2)^{th}$ gate electrode G4-2 may be integral with each other in neighboring pixels. Specifically, the $(4-1)^{th}$ gate electrode G4-1 of the first pixel circuit PC1 and the $(4-1)^{th}$ gate electrode G4-1 of the second pixel circuit PC2 may be integral with each other and may have an isolated shape. Also, the $(4-2)^{th}$ gate electrode G4-2 of the first pixel circuit PC1 and the $(4-2)^{th}$ gate electrode G4-2 of the second pixel circuit PC2 may be integral with each other and may extend in the first direction DR1.

As illustrated in FIG. 8, the first gate contact hole 81 may be formed in a layer between the second gate layer GL2 of FIG. 6 and the third gate layer GL3 of FIG. 8. The first gate contact hole 81 may electrically connect the $(4-1)^{th}$ gate electrode G4-1 to the $(4-2)^{th}$ gate electrode G4-2. Accordingly, in case that a design space is limited, only the $(4-1)^{th}$ gate electrode G4-1, which may be the lower gate electrode, among the gate electrodes of the fourth transistor T4 having a double gate structure may be formed in a wiring shape, and the $(4-2)^{th}$ gate electrode G4-2, which may be the upper gate electrode, may be formed in an isolated shape rather than a wiring shape. For example, the $(4-2)^{th}$ gate electrode G4-2 included in the third gate layer GL3 may be electrically connected to the $(4-1)^{th}$ gate electrode G4-1 included in the first gate layer GL1 through the first gate contact hole 81, and thus, the wiring-shaped $(4-1)^{th}$ gate electrode G4-1 may be used as a control signal transmission path.

As a specific example of the case in which the design space is limited, the first connection line BL1 extending in the first direction DR1 may be added to an area adjacent to the fourth transistor T4. Thus, a space in which all the (4-1)$^{th}$ and (4-2)$^{th}$ gate electrodes G4-1 and G4-2 of the fourth transistor T4 are to be formed in the wiring shape may be limited. The first connection line BL1 will be described in detail below with reference to FIG. 9.

The gate initialization voltage line VIL1 may be electrically connected to the second active layer AL2 through the second gate contact hole 83 formed in a layer covering the second active layer AL2. Specifically, the second gate contact hole 83 may be formed in a layer between the second active layer AL2 and the third gate layer GL3 and may be electrically connected to the gate initialization voltage line VIL1 included in the third gate layer GL3 and the fourth source region S4 of the semiconductor layer of the fourth transistor T4 included in the second active layer AL2. The second gate contact hole 83 may not be formed for each pixel, and may be shared by neighboring pixels. For example, the second gate contact hole 83 may be located on a virtual axis AX that passes between the first pixel circuit PC1 and the second pixel circuit PC2. Also, the gate initialization voltage line VIL1 may extend in the first direction DR1 over the first pixel circuit PC1 and the second pixel circuit PC2 and may be integral with each other, and the fourth source region S4 of the first pixel circuit PC1 and the fourth source region S4 of the second pixel circuit PC2 may also be integral with each other. The gate initialization voltage line VIL1 may be electrically connected to the fourth source region S4 of the first pixel circuit PC1 and the fourth source region S4 of the second pixel circuit PC2 through one second gate contact hole 83.

The first source/drain layer SDL1 of FIG. 9 may include the first connection line BL1 and the anode initialization voltage line VIL2 extending in the first direction DR1. For reference, contact holes including a connection line contact hole 91 illustrated in FIG. 10 may be formed in the first to fourth gate insulating layers and/or the first interlayer insulating layer and may electrically connect the layers illustrated in FIG. 10 to the layer located therebelow.

The first connection line BL1 may not overlap the (4-1)$^{th}$ gate electrode G4-1 and the (4-2)$^{th}$ gate electrode G4-2. For example, because the first connection line BL1 may be apart from the gate electrodes of the fourth transistor T4 without overlapping the gate electrodes of the fourth transistor T4, the influence of the first connection line BL1 on the fourth transistor T4 may be reduced. As described above, the design space reduced in this manner may be improved by forming the (4-2)$^{th}$ gate electrode G4-2 in the isolated shape and electrically connecting the wiring-shaped (4-1)$^{th}$ gate electrode G4-1 to the wiring-shaped (4-2)$^{th}$ gate electrode G4-2 through the first gate contact hole 81. In other embodiments, the first connection line BL1 may overlap elements that may not be affected even in case that the elements overlap the first connection line BL1. For example, the first connection line BL1 may overlap the gate initialization voltage line VIL1.

In an embodiment, the first connection line BL1 may be a line added for reducing the area of a dead space. As a specific example, the first connection line BL1 may be a line that connects the data line DL to an input line (not illustrated). The data lines DL extend from a non-display area to a display area. Also, input lines may input data signals to be applied to the data lines DL, and may be apart from each other in the non-display area. The input lines may be electrically connected to correspond to the data lines DL, respectively. The data lines DL may be concentrated while bypassing the edge area of the display panel so as to be electrically connected to the input lines, thereby forming a dead space. In order to reduce the area of the dead space, the input lines may be located relatively at the center of the display panel, instead of being located in the vicinity of the data lines DL corresponding thereto. With this structure, the area of the dead space in the vicinity of the outside of the display area may be drastically reduced.

The first connection line BL1 according to an embodiment may extend in the first direction DR1. An end of the first connection line BL1 may be electrically connected to the data line DL and passes through the display area across the upper portion of the adjacent data line DL so as not to come in contact with the adjacent data line DL, and another end of the first connection line BL1 may be electrically connected to the second connection line BL2 (see FIG. 10) through the connection line contact hole 91. Also, the second connection line BL2 extends in the second direction DR2 intersecting with the first direction DR1 and may be electrically connected to the input line in the non-display area. Accordingly, the data line DL may be electrically connected to the input line through a path passing through the display area using the first connection line BL1 and the second connection line BL2.

The second source/drain layer SDL2 of FIG. 10 may include the driving voltage line PL, the data line DL, and the second connection line BL2. Specifically, the second source/drain layer SDL2 may include the driving voltage line PL, the data line DL, and the second connection line BL2, each extending in the second direction DR2 intersecting with the first direction DR1. For reference, the contact holes illustrated in FIG. 10 may be formed in the second interlayer insulating layer and may connect the layers illustrated in FIG. 10 to the layer located therebelow.

The driving voltage line PL may be shared by neighboring pixels. For example, the driving voltage line PL may be between the first pixel circuit PC1 and the second pixel circuit PC2, may be electrically connected to the first pixel circuit PC1 and the second pixel circuit PC2, and may supply the driving voltage ELVDD. The driving voltage line PL may be electrically connected to a portion of the first source/drain layer SDL1 through the contact hole formed in the layer between the first source/drain layer SDL1 and the second source/drain layer SDL2, and a portion of the first source/drain layer SDL1 electrically connected to the driving voltage line PL may be electrically connected to the fifth source region S5 of the fifth transistor T5 through the contact hole formed in the layer between the first source/drain layer SDL1 and the first active layer AL1. Finally, the driving voltage line PL may be electrically connected to the fifth transistor T5.

The data line DL may be electrically connected to a portion of the first source/drain layer SDL1 through the contact hole formed in the layer between the first source/drain layer SDL1 and the second source/drain layer SDL2, and a portion of the first source/drain layer SDL1 electrically connected to the data line DL may be electrically connected to the second source region S2 of the second transistor T2 through the contact hole formed in the layer between the first source/drain layer SDL1 and the first active layer AL1. Finally, the data line DL may be electrically connected to the second transistor T2.

The second connection line BL2 may be electrically connected to the first connection line BL1 through the connection line contact hole 91 formed in a layer between the first source/drain layer SDL1 and the second source/ drain layer SDL2 and may be electrically connected to the input line in the non-display area.

Each of the first source/drain layer SDL1 of FIG. 9 and the second source/drain layer SDL2 of FIG. 10 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). Each of these layers may have a single layer structure or a multilayer structure. In case that each of these layers has the multilayer structure, each of these layers may include various materials. For example, each of the first source/drain layer SDL1 of FIG. 9 and the second source/drain layer SDL2 of FIG. 10 may have a two-layer structure of a titanium layer/aluminum layer or a three-layer structure of a titanium layer/aluminum layer/titanium layer.

A planarization layer (not illustrated) covering the second source/drain layer SDL2 may be located on the second source/drain layer SDL2. A contact hole (not illustrated) may be formed in the planarization layer to electrically connect the pixel electrode of the organic light-emitting diode OLED on the planarization layer to the second source/drain layer SDL2. The planarization layer may include an organic material such as acryl, benzocyclobutene (BCB), polyimide, hexamethyldisiloxane (HMDSO), or a combination thereof. The disclosure is not limited thereto, and the planarization layer may include an inorganic material in case desired and may have a single layer structure or a multilayer structure.

The first gate contact hole 81 will be described in detail below with reference to FIGS. 11 to 13.

Figure 11:
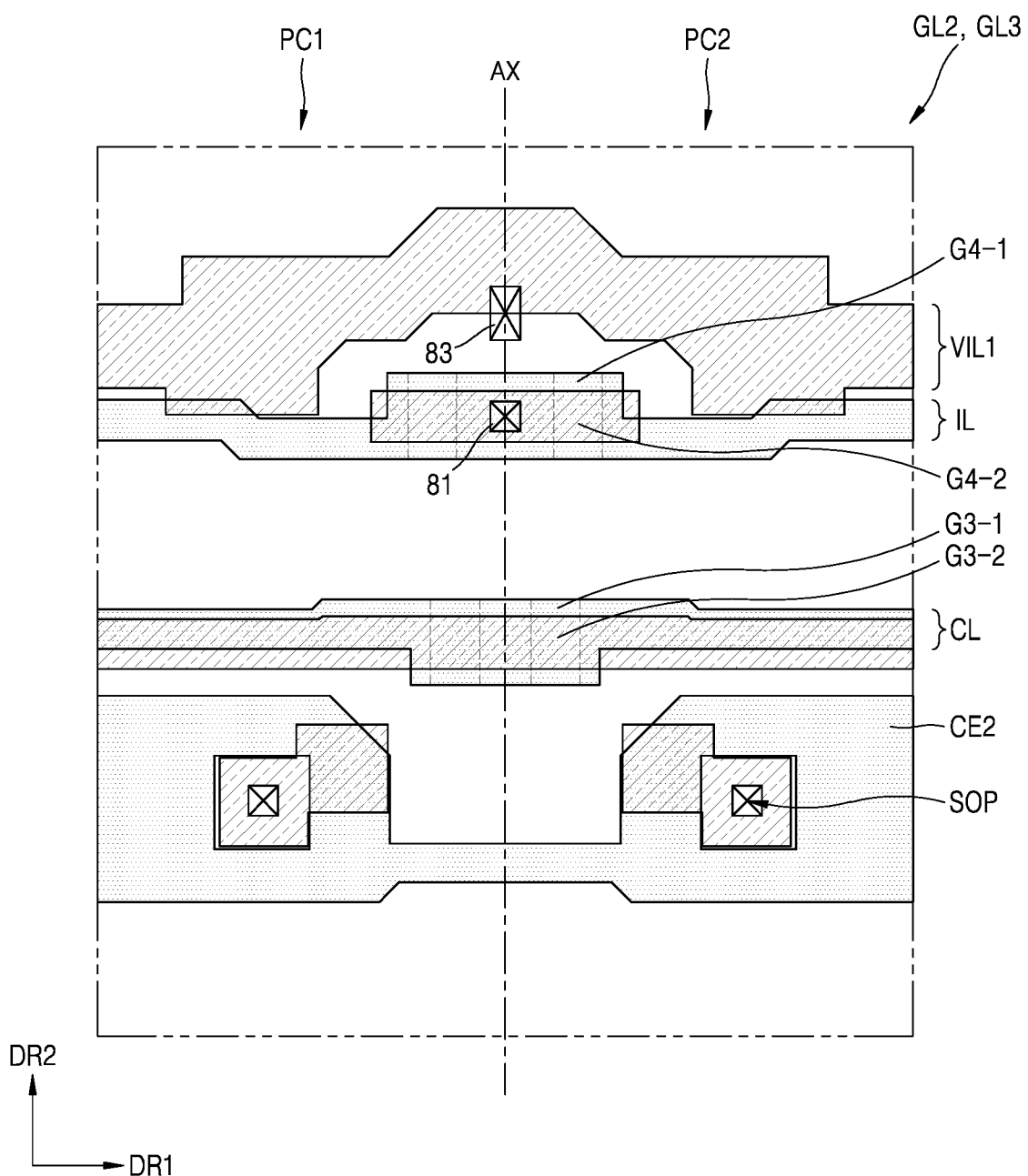
FIG. 11 is a schematic layout diagram of some layers of FIG. 3, according to an embodiment.
Figure 13:
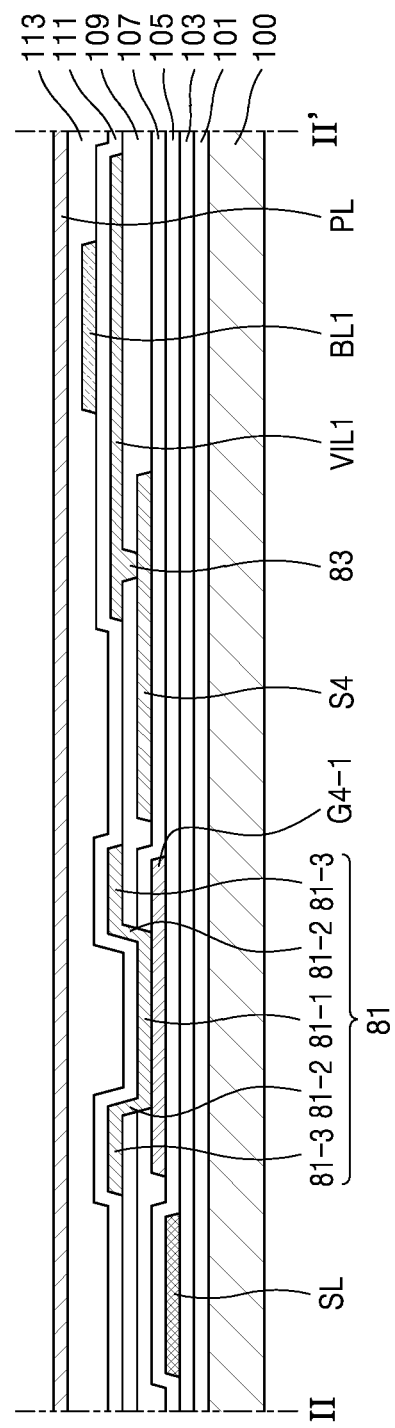
FIG. 13 is a schematic cross-sectional view of the pixel circuits taken along line II-II' of FIG. 3, according to an embodiment.

FIG. 11 is a schematic layout diagram of some layers of FIG. 3, according to an embodiment, FIG. 12 is a schematic cross-sectional view of the first and second pixel circuits PC1 and PC2 taken along line I-I' of FIG. 3, according to an embodiment, and FIG. 13 is a schematic cross-sectional view of the first and second pixel circuits PC1 and PC 2 taken along line II-II' of FIG. 3, according to an embodiment. Specifically, FIG. 11 illustrates the second gate layer GL2 of FIG. 6 and the third gate layer GL3 of FIG. 8 in the layout diagram of FIG. 3, and other layers are omitted.

As illustrated in FIGS. 11 to 13, the first gate contact hole 81 may be formed in the layer between the $(4-1)^{th}$ gate electrode G4-1 and the $(4-2)^{th}$ gate electrode G4-2 and expose a portion of the upper surface of the $(4-1)^{th}$ gate electrode G4-1. Also, the second gate contact hole 83 may include an inner surface inclined with respect to the exposed upper surface of the $(4-1)^{th}$ gate electrode G4-1. The $(4-2)^{th}$ gate electrode G4-2 may be formed above the $(4-1)^{th}$ gate electrode G4-1 so as to cover the upper surface of the $(4-1)^{th}$ gate electrode G4-1 exposed through the first gate contact hole 81 and the inner surface of the first gate contact hole 81. The $(4-2)^{th}$ gate electrode G4-2 may be electrically connected to the $(4-1)^{th}$ gate electrode G4-1 by coming into contact with the $(4-1)^{th}$ gate electrode G4-1 at the exposed portion of the $(4-1)^{th}$ gate electrode G4-1. Therefore, even in case that the $(4-2)^{th}$ gate electrode G4-2 is not formed in the wiring shape extending in the first direction DR1 or the second direction DR2 and has an isolated shape, the $(4-2)^{th}$ gate electrode G4-2 may receive the control signal using the wiring-shaped $(4-1)^{th}$ gate electrode G4-1 and serve as the control electrode. Therefore, a space occupied by the $(4-2)^{th}$ gate electrode G4-2 may be reduced, thereby securing a design space.

The first gate contact hole 81 may not be provided for each pixel (or each pixel circuit) and may be shared by neighboring pixels (or pixel circuits). For example, as illustrated in FIG. 11, the first gate contact hole 81 may be located on a virtual axis AX passing between the first pixel circuit PC1 located in the first pixel and the second pixel circuit PC2 located in the second pixel. For example, the first gate contact hole 81 may be located in the central portion of the $(4-1)^{th}$ gate electrode G4-1 having the isolated shape and may electrically connect the $(4-1)^{th}$ gate electrode G4-1 and the $(4-2)^{th}$ gate electrode G4-2 integral with each other in the first pixel circuit PC1 and the second pixel circuit PC2, which may be neighboring pixels.

In an embodiment, a diameter L1 of the upper surface of the $(4-1)^{th}$ gate electrode G4-1 exposed through the first gate contact hole 81 may be less than a distance L2 between the end of the first gate contact hole 81 in a direction of the fourth active region A4 of the fourth transistor T4 and the end of the fourth active region A4 of the fourth transistor T4 in a direction of the first gate contact hole 81. As illustrated in FIGS. 11 and 12, the first gate contact hole 81 may be between the fourth active regions A4 of the fourth transistor T4. In case that an interval between the first gate contact hole 81 and the fourth active region A4 is insufficient, a short circuit may occur in the fourth transistor T4 at the time of manufacturing or using the display apparatus, or defects may occur due to a change in device characteristics, such as an increase in circuit resistance. According to an embodiment, because the diameter L1 of the first gate contact hole 81 may be less than the distance from the first gate contact hole 81 to the fourth active region A4, device characteristics may be improved and defects that may occur during manufacturing or use may be prevented.

For example, L1 may be formed to be greater than L2 in a range in which the diameter L1 of the first gate contact hole 81 may be about 2.6 μm or less and the distance L2 between the end of the first gate contact hole 81 in the direction of the fourth active region A4 of the fourth transistor T4 and the end of the fourth active region A4 of the fourth transistor T4 in the direction of the first gate contact hole 81 may be about 2.2 μm or more.

In another embodiment, a cross-sectional area of the first gate contact hole 81 parallel to the upper surface of the $(4-1)^{th}$ gate electrode G4-1 may increase in a direction away from the $(4-1)^{th}$ gate electrode G4-1. For example, as illustrated in FIGS. 12 and 13, the inner surface of the first gate contact hole 81 may be inclined toward the outside. Therefore, the $(4-2)^{th}$ gate electrode G4-2 covering the inner surface of the first gate contact hole 81 may also be inclined toward the outside of the first gate contact hole 81. Thus, it may be possible to prevent device characteristics from being changed because hydrogen may be introduced into the fourth active region A4 due to a defect (e.g., chemical vapor deposition (CVD) seam) that may occur in case that the insulating layer may be formed on the $(4-2)^{th}$ gate electrode G4-2.

As a specific example of a method of adjusting the inclination angle of the inner surface of the first gate contact hole 81, there may be a method of changing a profile of a photoresist pattern or etching gas used in an etching process. For example, $CF_4/O_2$ or $CHF_3/Ar$-based etching gas may be used in the etching process so that the inner surface of the first gate contact hole 81 may be inclined toward the outside, but the disclosure is not limited thereto.

In another embodiment, the $(4-2)^{th}$ gate electrode G4-2 may include a portion 81-1 covering the upper surface of the $(4-1)^{th}$ gate electrode G4-1 exposed by the first gate contact hole 81, a portion 81-2 covering the inner surface of the first gate contact hole 81, an a portion 81-3 extending from a portion within the first gate contact hole 81 and located on a layer covering the second active layer AL2. The portions 81-1, 81-2, and 81-3 of the (4-2)$^{th}$ gate electrode G4-2 may be integral with each other. Because the (4-2)$^{th}$ gate electrode G4-2 has the portion 81-3 that extends from the end of the portion 81-2 covering the inner surface of the first gate contact hole 81, without being disconnected, and may be located on the layer covering the second active layer AL2, the (4-2)$^{th}$ gate electrode G4-2 may be formed with better quality, as compared with a case in which the insulating layer may be formed on the (4-2)$^{th}$ gate electrode G4-2. For example, the (4-2)$^{th}$ gate electrode G4-2 may extend in the second direction DR2 from the portion 81-2 covering the inner surface of the first gate contact hole 81, and may be located so as to overlap the end of the (4-1)$^{th}$ gate electrode G4-1 in the second direction DR2.

Although the pixel and the display apparatus including the same have been described, the disclosure is not limited thereto. For example, methods of manufacturing the pixel and the display apparatus including the same will also fall within the scope of the disclosure.

According to one or more embodiments, the pixel having improved characteristics and reduced defects due to the improved structure of the pixel circuit and the display apparatus including the pixel may be implemented. The scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including their equivalents.

What is claimed is:

1. A display apparatus comprising:
   a substrate comprising a display area in which pixel circuits are disposed;
   a first active layer disposed on the substrate, the first active layer comprising:
   a first source region;
   a first active region adjacent to the first source region; and
   a first drain region adjacent to the first active region;
   a first gate layer disposed on a layer covering the first active layer, the first gate layer comprising a first gate electrode overlapping the first active region;
   a second gate layer disposed on a layer covering the first gate layer, the second gate layer comprising an initialization line extending in a first direction and including a first part of a second gate electrode;
   a second active layer disposed on a layer covering the second gate layer, the second active layer comprising a second active region overlapping the first part of the second gate electrode;
   a third gate layer disposed on a layer covering the second active layer, the third gate layer comprising a second part of the second gate electrode overlapping the second active region, the second part of the second gate electrode having an isolated shape; and
   a first source layer or a first drain layer disposed on a layer covering the third gate layer, the first source layer or the first drain layer comprising a first connection line extending in the first direction.

2. The display apparatus of claim 1, wherein the first connection line does not overlap the first part of the second gate electrode and the second part of the second gate electrode.

3. The display apparatus of claim 1, wherein the first part of the second gate electrode and the second part of the second gate electrode are electrically connected to each other through a first gate contact hole formed in a layer between the second gate layer and the third gate layer.

4. The display apparatus of claim 3, wherein
   the first gate contact hole exposes an upper surface of the first part of the second gate electrode and comprises an inner surface inclined with respect to the upper surface of the first part of the second gate electrode, and
   the second part of the second gate electrode covers the upper surface of the first part of the second gate electrode exposed through the first gate contact hole and the inner surface of the first gate contact hole.

5. The display apparatus of claim 4, wherein a diameter of the upper surface of the first part of the second gate electrode exposed through the first gate contact hole is less than a distance between an end of the first gate contact hole in a direction of the second active region and an end of the second active region in a direction of the first gate contact hole.

6. The display apparatus of claim 4, wherein a cross-sectional area of the first gate contact hole is parallel to the upper surface of the first part of the second gate electrode increases in a direction away from the first part of the second gate electrode.

7. The display apparatus of claim 4, wherein the second part of the second gate electrode has a portion extending from a portion within the first gate contact hole and disposed on the layer covering the second active layer.

8. The display apparatus of claim 4, wherein
   the pixel circuits comprise a first pixel circuit and a second pixel circuit, and
   the first pixel circuit and the second pixel circuit are symmetric with respect to a virtual axis between the first pixel circuit and the second pixel circuit.

9. The display apparatus of claim 8, wherein
   the first part of the second gate electrode corresponding to the first pixel circuit and the first part of the second gate electrode corresponding to the second pixel circuit are integral with each other,
   the second part of the second gate electrode corresponding to the first pixel circuit and the second part of the second gate electrode corresponding to the second pixel circuit are integral with each other, and
   the first gate contact hole is disposed on the virtual axis.

10. The display apparatus of claim 1, wherein
    the third gate layer comprises a gate initialization voltage line extending in the first direction, and
    the first connection line overlaps the gate initialization voltage line.

11. The display apparatus of claim 10, wherein the gate initialization voltage line is electrically connected to the second active layer through a second gate contact hole formed in the layer covering the second active layer.

12. The display apparatus of claim 1, further comprising a second source layer or a second drain layer disposed on a layer covering the first source layer or the first drain layer,
    wherein the second source layer or the second drain layer comprises a second connection line extending in a second direction intersecting with the first direction and electrically connected to the first connection line.

13. The display apparatus of claim 1, wherein
the first active layer comprises a silicon semiconductor, and
the second active layer comprises an oxide semiconductor.

14. A pixel comprising:
an organic light-emitting diode;
a first transistor comprising a first semiconductor layer comprising a silicon semiconductor and a first gate electrode, wherein the first transistor controls a current flowing to the organic light-emitting diode according to a voltage applied to the first gate electrode;
a second transistor electrically connected to the first transistor, the second transistor comprising:
 a second semiconductor layer comprising an oxide semiconductor;
 a first part of a second gate electrode disposed below the second semiconductor layer; and
 a second part of the second gate electrode disposed above the second semiconductor layer and having an isolated shape;
an initialization line extending in a first direction, the initialization line comprising the second part of the second gate electrode; and
a first connection line extending in the first direction.

15. The pixel of claim 14, wherein the first connection line does not overlap the first part of the second gate electrode and the second part of the second gate electrode.

16. The pixel of claim 14, wherein
the first part of the second gate electrode and the second part of the second gate electrode are electrically connected to each other through a first gate contact hole,
the first gate contact hole exposes an upper surface of the first part of the second gate electrode and comprises an inner surface inclined with respect to the upper surface of the first part of the second gate electrode, and
the second part of the second gate electrode covers the upper surface of the first part of the second gate electrode exposed through the first gate contact hole and the inner surface of the first gate contact hole.

17. The pixel of claim 16, wherein a diameter of the upper surface of the first part of the second gate electrode exposed through the first gate contact hole is less than a distance between an end of the first gate contact hole in a direction of an active region of the second semiconductor layer and an end of the active region in a direction of the first gate contact hole.

18. The pixel of claim 16, wherein a cross-sectional area of the first gate contact hole parallel to the upper surface of the first part of the second gate electrode increases in a direction away from the upper surface of the first part of the second gate electrode.

19. The pixel of claim 16, wherein the second part of the second gate electrode has a portion extending from a portion within the first gate contact hole and disposed on a layer covering the second semiconductor layer.

20. The pixel of claim 14, further comprising a second connection line extending in a second direction intersecting with the first direction and electrically connected to the first connection line.

\* \* \* \* \*